(12) United States Patent
Chiu et al.

(10) Patent No.: US 7,444,613 B1
(45) Date of Patent: Oct. 28, 2008

(54) SYSTEMS AND METHODS FOR MAPPING ARBITRARY LOGIC FUNCTIONS INTO SYNCHRONOUS EMBEDDED MEMORIES

(75) Inventors: Gordon Chiu, Richmond Hill (CA); Deshanand Singh, Mississauga (CA); Valavan Manohararajah, Scarborough (CA); Stephen Brown, Toronto (CA)

(73) Assignee: Altera Corporation, San Jose, CA (US)

( * ) Notice: Subject to any disclaimer, the term of this patent is extended or adjusted under 35 U.S.C. 154(b) by 320 days.

(21) Appl. No.: 11/408,762

(22) Filed: Apr. 21, 2006

(51) Int. Cl.
*G06F 17/50* (2006.01)

(52) U.S. Cl. .......................................... 716/17; 716/18

(58) Field of Classification Search ........................ None
See application file for complete search history.

(56) References Cited

U.S. PATENT DOCUMENTS

| | | | | |
|---|---|---|---|---|
| 6,195,788 | B1 * | 2/2001 | Leaver et al. | 716/18 |
| 6,519,743 | B1 * | 2/2003 | Nauts et al. | 716/3 |
| 7,020,864 | B1 * | 3/2006 | Loong | 716/16 |
| 7,100,141 | B1 * | 8/2006 | Ratchev et al. | 716/16 |
| 7,124,392 | B2 * | 10/2006 | Sharma | 716/17 |
| 7,257,799 | B2 * | 8/2007 | McKenney et al. | 716/16 |

OTHER PUBLICATIONS

Cong et al., "Technology Mapping for FPGAs with Embedded Memory Blocks," Proceedings of the ACM/SIGDA Int'l Symposium on FPGAs, Feb. 1998, pp. 179-188.*

Heile et al., "Hybrid Product Terms and LUT Based Architectures Using Embedded Memory Blocks," Int'l Symposium on FPGAs, 1999, pp. 13-16.*

Kumar et al., "MemMap-pd: Performance Driven Technology Mapping Algorithm for FPGAs with embedded Memory Arrays," Design, Automation and Test in Europe Conference and Exhibition vol. II, 2001, pp. 922-929.*

Wilton, "Heterogeneous Technology Mapping for Area Reduction in FPGAs with Embedded Memory Arrays," IEEE Transactions on CAD of ICs and Systems, vol. 19, Jan. 2000, pp. 56-68.*

* cited by examiner

*Primary Examiner*—Leigh Marie Garbowski
(74) *Attorney, Agent, or Firm*—Ropes & Gray LLP; Michael J. Chasan

(57) ABSTRACT

Systems and methods are provided for mapping logic functions from logic elements ("LEs") into synchronous embedded memory blocks ("EMBs") of programmable logic devices ("PLDs"). This technique increases the amount of logic that can fit into the PLD. Where area savings are significant, smaller PLDs may be selected to implement a particular circuit. One aspect of the invention relates to methods for identifying sequential cones of logic that may be mapped into synchronous EMBs. After the sequential logic cones are identified for mapping into a synchronous EMB, the logic cone may be selected, expanded, restructured, and retimed, as necessary, to implement the mapping. Another aspect of the invention relates to techniques for handling architectural restrictions of synchronous EMBs, such as the inability to implement the asynchronous behavior of synchronous logic.

38 Claims, 14 Drawing Sheets

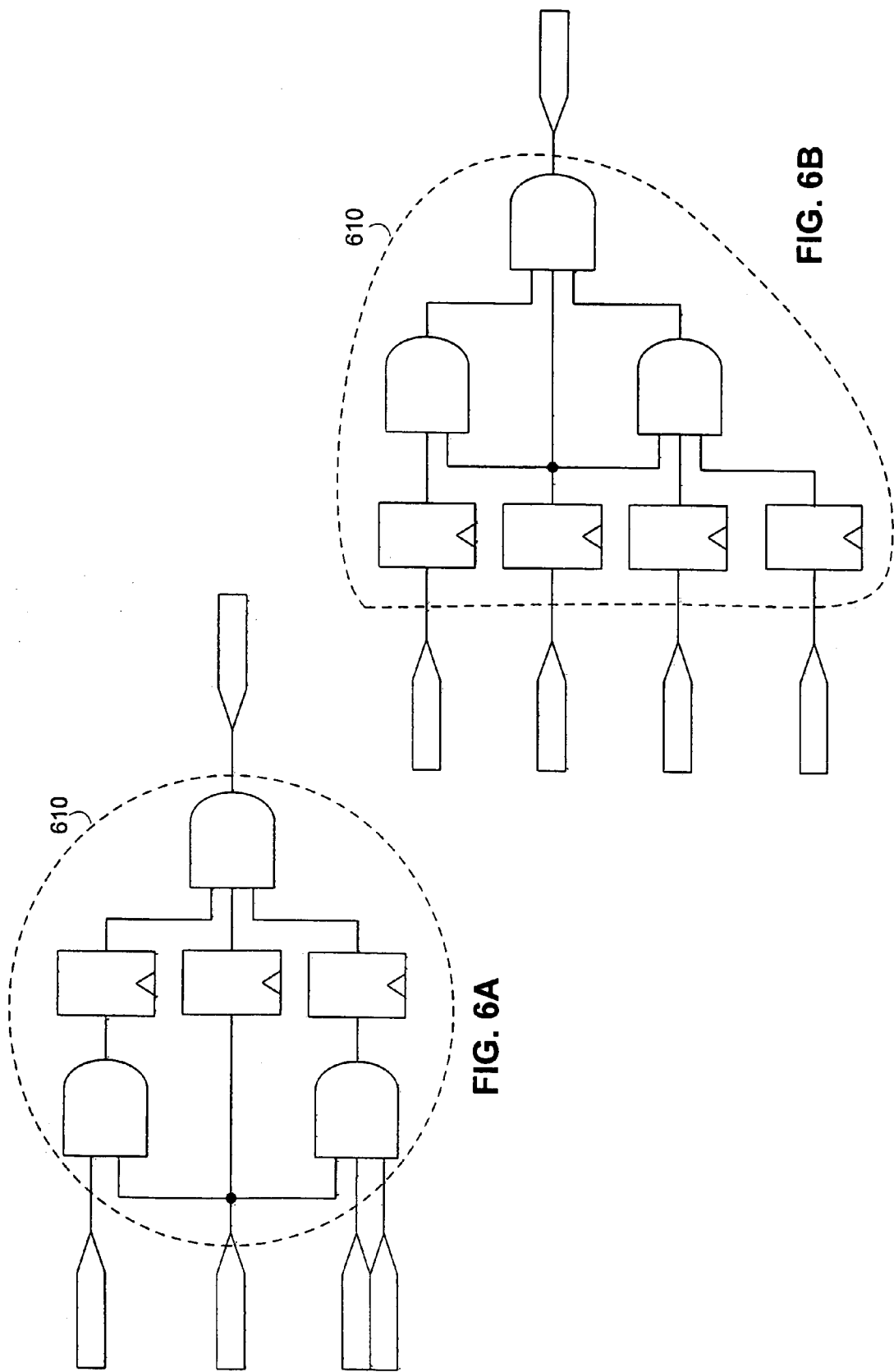

SYSTEMS AND METHODS FOR MAPPING ARBITRARY LOGIC FUNCTIONS INTO SYNCHRONOUS EMBEDDED MEMORIES

BACKGROUND

This invention relates to programmable logic device ("PLD") integrated circuits and other devices of that general type (all referred to generically herein as PLDs). More particularly, the invention relates to systems and methods for mapping logic functions into synchronous embedded memory blocks ("EMBs") of a PLD.

PLDs are typically made up of I/O resources, interconnect resources, logic resources, and memory resources. PLDs may also contain other resources, such as digital signal processing blocks ("DSPs") and other embedded processing resources. The logic resources typically include logic elements ("LEs") grouped in clusters that are sometimes referred to as logic array blocks ("LABs"). The memory resources typically include EMBs of various sizes.

Modern PLDs include an increasing number of EMBs that may be used as on-chip memories. While there are some applications that that make use of this on-chip memory, the area devoted to the EMBs may be wasted when applications do not utilize this built in memory.

One solution to this problem is to use unutilized EMBs as a read only memory ("ROM") that is capable of implementing multi-input multi-output logic functions. A truth table containing all of the potential input signals of a particular logic function and their associated output functions may be stored in a ROM. Thus, logic that would traditionally be mapped into LEs may instead be placed into unused EMBs. This technique may increase the amount of logic that can fit into the PLD. Where area savings are significant, smaller PLDs may be selected to implement the particular circuit.

Earlier use of fully asynchronous or switchable asynchronous/synchronous memories in PLDs has largely shifted to fully synchronous memories. There are several notable differences between synchronous memories and their traditional asynchronous counterparts. Most importantly, synchronous memories require all read and write operations to be synchronized to a clock edge. In contrast, asynchronous memories may perform read and write operations independent of a clock signal.

Instead of relying on a clock signal, asynchronous memories have strict timing constraints regarding setup and hold times for address and data lines before writing or reading may be enabled. Synchronous memories avoid these complications as the designer need only ensure that the address, data, and control signals reach the memory interface before the next active clock edge. The synchronous memory block automatically generates internal control signals that are designed to meet these setup and hold constraints. Simpler timing and potential for power savings have made synchronous EMBs increasingly popular in modern PLDs.

Various techniques for mapping combinational logic clusters into EMBs have been considered. However, these techniques cannot be used to map logic into the synchronous EMBs present in modern PLDs.

SUMMARY

In accordance with certain aspects of the invention, systems and methods for mapping arbitrary logic functions into synchronous embedded memory blocks ("EMBs") are provided.

One aspect of the invention relates to methods for identifying logic that may be mapped into synchronous EMBs. After the logic is identified for mapping into a synchronous EMB, a cone of logic may be selected, expanded, restructured, and retimed, as necessary, to implement the mapping. These methods preferably permit the amount of logic mapped into the synchronous memory to be maximized, thereby maximizing the area savings in the programmable logic device ("PLD"). It should be understood that other constraints, such as timing considerations as well as logic overhead introduced by the mapping may affect the number of logic elements ("LEs") eliminated by the mapping. Further, where the area savings from potential mappings do not result in the selection of a smaller PLD, some or all of the mappings may not be implemented.

Another aspect of the invention relates to techniques for handling architectural restrictions of synchronous EMBs, such as the inability to implement the asynchronous reset of asynchronous logic clusters. According to one embodiment, additional circuitry may be added to the mapped synchronous EMBs to add the functionality of an asynchronous reset signal.

Further features of the invention, its nature and various advantages will be more apparent from the accompanying drawings and the following detailed description.

BRIEF DESCRIPTION OF THE DRAWINGS

FIGS. 6A and 6B are simplified schematic block diagrams illustrating the retiming of a logic cone for mapping into a synchronous EMB in accordance with the invention.

DETAILED DESCRIPTION

Figure 1:
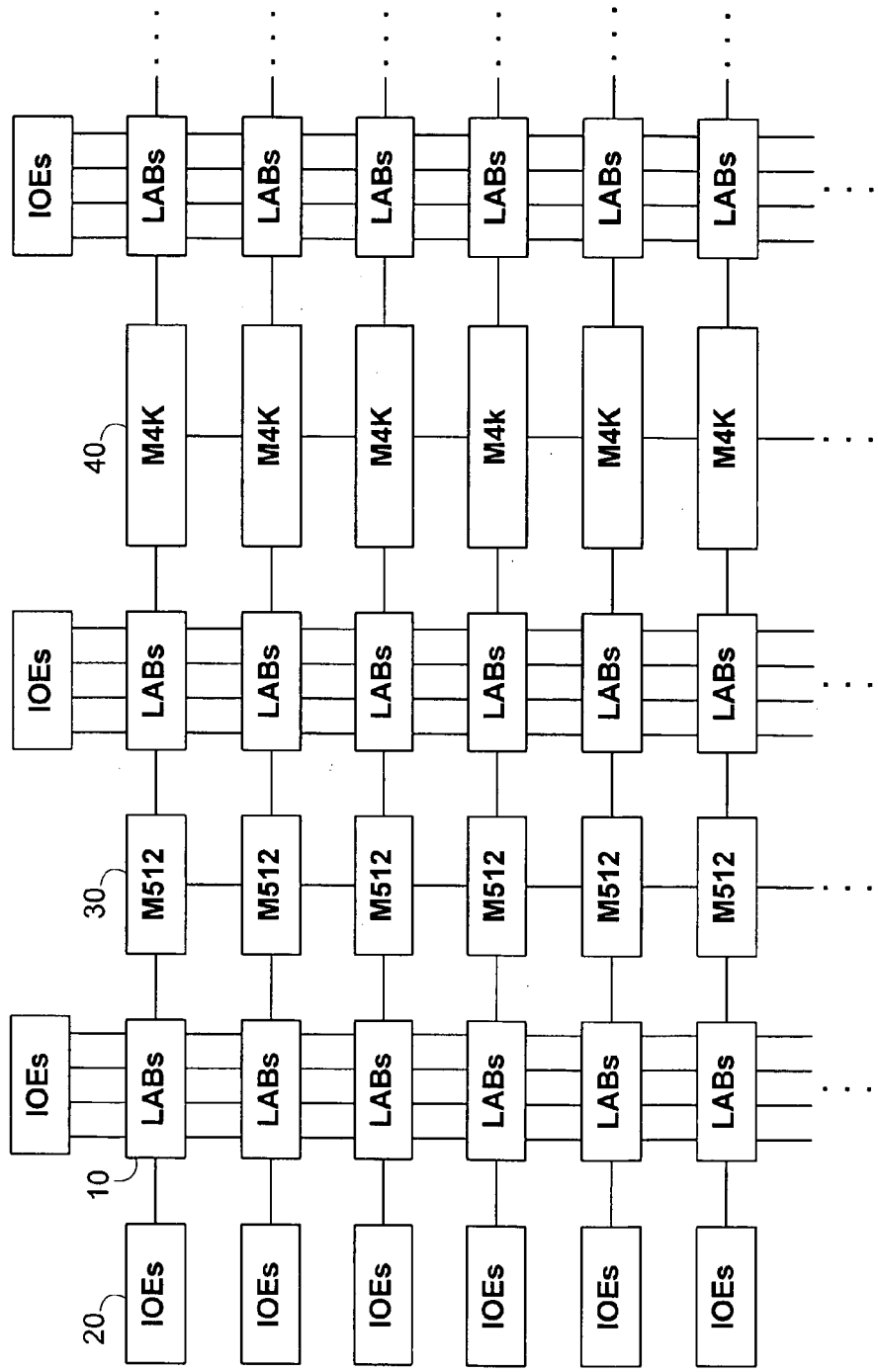
FIG. 1 is a simplified schematic block diagram of a representative portion of a known programmable logic device ("PLD") architecture.

A representative portion of a known PLD architecture is shown in FIG. 1. As shown in this FIG., a programmable logic device ("PLD") includes many logic elements ("LEs") (not shown) that are clustered together in many logic array blocks ("LABs") 10. For example, there may be 16 LEs in each LAB 10. A typical LE may contain a four input lookup table ("4-LUT"), a register, and some logic that is programmable (configurable) to create logic circuitry. The PLD also includes I/O ("IOEs") elements 20 and two types of embedded memory blocks ("EMBs"), the 512-bit M512 30 and the 4096-bit blocks M4K 40. Both of these EMBs are synchronous, requiring registered address, data, and control signals. The outputs of the EMBs may also be registered. The PLD may also contain embedded processors, such as digital signal processing blocks ("DSPs"), other types or sizes of EMBs, or any other suitable elements.

Figures 2A, 2B:
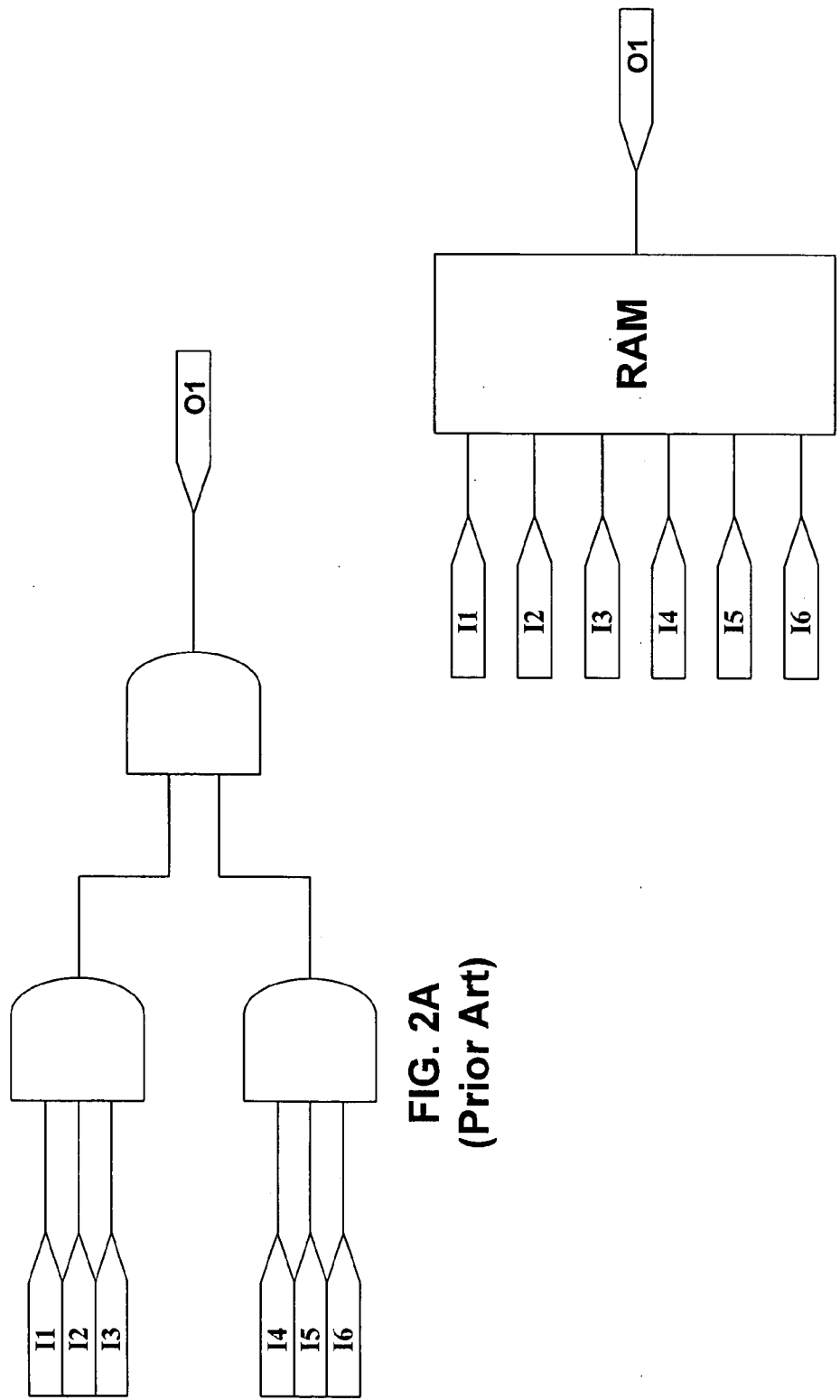
FIGS. 2A and 2B are simplified schematic block diagrams illustrating known techniques for mapping combinational logic functions into asynchronous embedded memory blocks ("EMBs").

FIGS. 2A and 2B illustrate a known technique for mapping combinational logic functions into an asynchronous EMB. FIG. 2A shows a combinational logic function having six inputs (I1 through I6) and one output (I6). FIG. 2B shows an asynchronous EMB that implements the same logic function and contains the same inputs and outputs as the logic function of FIG. 2A. Mapping the logic function of FIG. 2A into the available memory block of FIG. 2B may reduce the number of logic elements required to implement a particular circuit and may allow a smaller PLD to be selected to implement a particular circuit. While techniques for mapping combinational logic functions into asynchronous memories are relatively straightforward, mapping logic functions, both combinational and sequential, into synchronous EMBs presents additional challenges.

Figure 3:
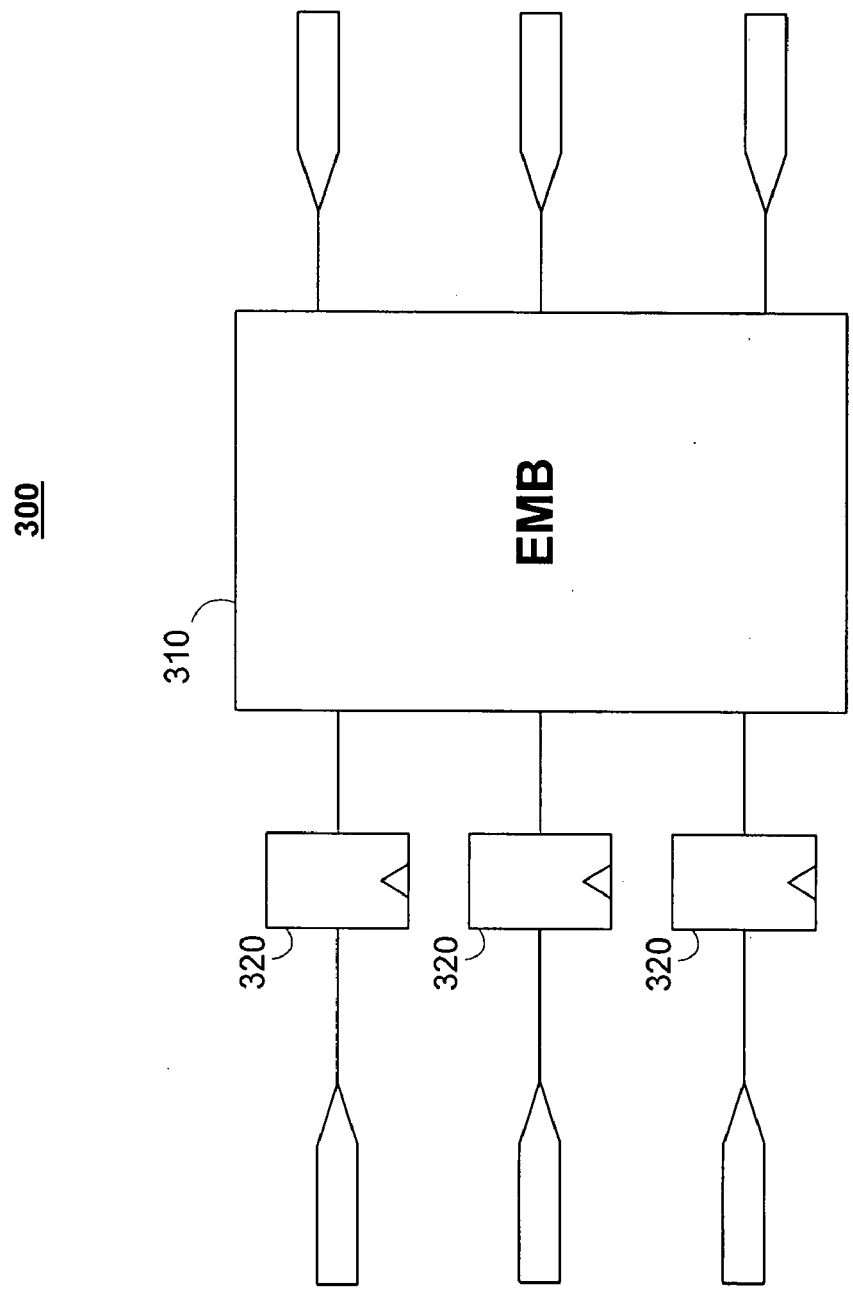
FIG. 3 is a simplified schematic block diagram illustrating a conceptualization of a synchronous EMB in accordance with the invention.

According to this invention techniques for mapping combinational and sequential logic elements into synchronous EMBs are provided. FIG. 3 is a conceptual illustration of synchronous EMB 300. Synchronous EMB 300 may be conceptualized as an asynchronous EMB 310 that has registers 320 connected to each of the EMB inputs.

The first step necessary for mapping logic into synchronous EMBs is identifying logic to be mapped. A logic circuit is made up of a group of nodes (sequential and combinational) and the connections and dependencies between those nodes. First, a seed node may be selected from a logic circuit. After the seed node is selected, a cone of logic may be grown from the seed node. The cone of logic, rooted at the seed node, is a sub-circuit containing the seed node, some of its predecessor nodes, and their connections. After the cone of logic is defined, the logic elements contained within the logic cone may be mapped into a synchronous EMB.

In order to maximize the amount of logic that may be mapped into the synchronous EMBs, the logic cones may be expanded (or grown) to include additional nodes, such as registers of the seed node and any other compatible registers (i.e., the registers that share all of the control signals with the input registers). Additional nodes may be added to the logic cone to increase the area savings that may result from mapping the logic into synchronous EMBs.

Figure 4:
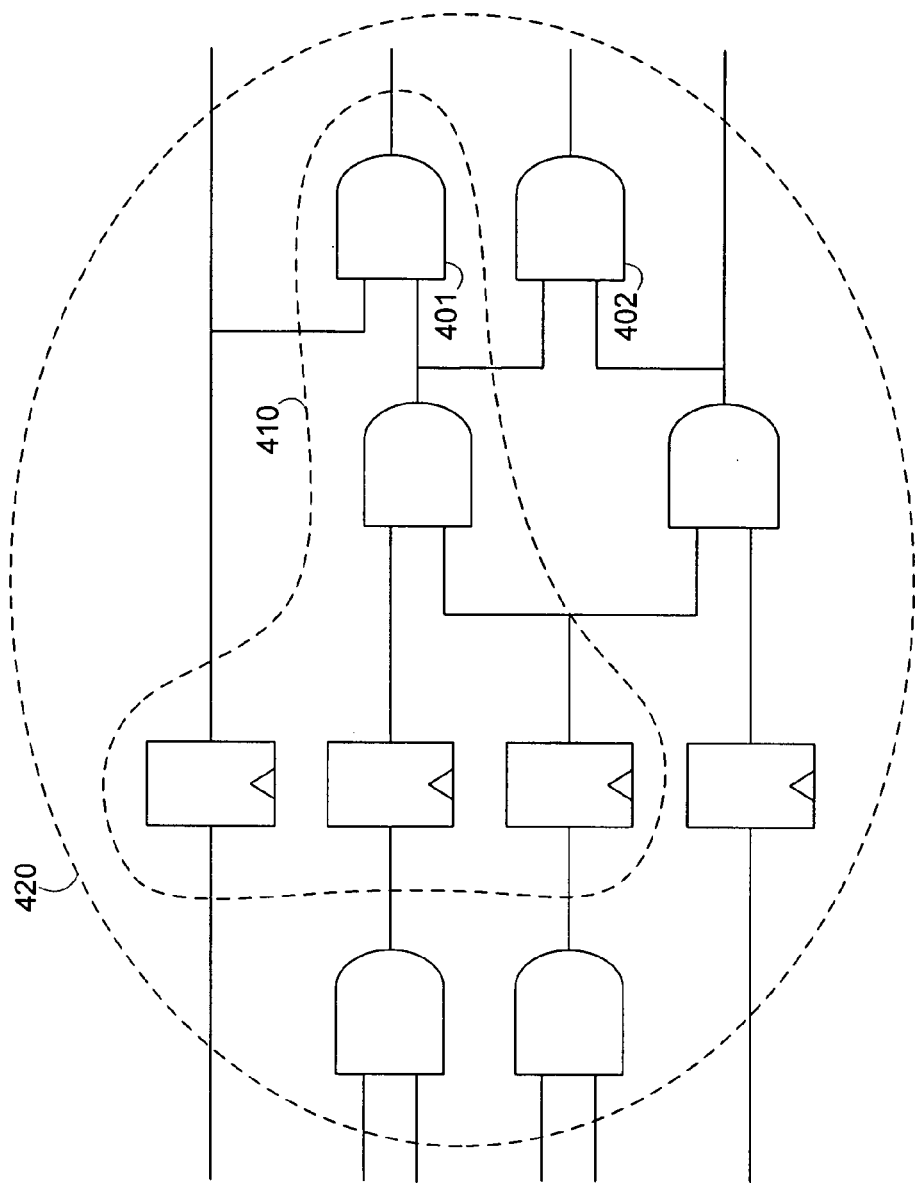
FIG. 4 is a simplified schematic block diagram illustrating the selection and expansion of a logic cone for mapping into a synchronous EMB.

One example of selecting and expanding a logic cone is illustrated in FIG. 4. According this example, AND gate 401 is selected as a seed node. Logic cone 410 is expanded from AND gate 401 and includes the input registers and nodes of AND gate 401. Then, AND gate 402 may be selected as a candidate node for expanding logic cone 410. Because the inputs to AND gate 402 contain a compatible input register, AND gate 402 may be added to logic cone 410 in addition to the input register and the combinational nodes from the input of the registers. All of these nodes may be added to logic cone 410 to become logic cone 420.

Any suitable technique may be used to identify, select, and expand the logic cones that may be mapped into the synchronous EMBs. Factors that may be considered in selecting and expanding particular logic cones include minimizing the area of the circuit and reducing the timing effects of the mapping.

Candidate logic cones and expanded logic cones may be analyzed to estimate area reduction resulting from their mapping into synchronous EMBs. First, the candidate logic cone must fit within the available synchronous EMBs. For example, the maximum number of logic inputs and outputs that will fit into the available EMBs may be calculated to determine the maximum logic cone size. Then, in order to calculate the effect of mapping each of the candidate logic cones into synchronous EMBs, each candidate logic cone may be associated with a cost function. The cost function may be a weighted sum of the area reduction cost of a particular mapping. The area reduction cost may be calculated based on the predicted reduction of the number of LEs, the predicted number of bits required to implement the logic cone in the EMBs, and the number of additional LEs that may be added to implement asynchronous reset behavior in the synchronous EMBs (which will be discussed in greater detail below). Thus, the selection and expansion of logic cones may be at least partially based on the size of available synchronous EMBs as well as maximizing area reduction in the PLD.

Candidate logic cones may also be analyzed to determine the timing effects of mapping logic cones into EMBs. Logic functions implemented in EMBs may be considerably slower than when they are implemented in the combinational lookup tables of the LEs. Therefore, mapping logic functions into the EMBs may reduce the maximum operating frequency of the circuit. These timing effects may be minimized by preventing the selection of critical combinational nodes in favor of other less-critical nodes. Further, during logic cone selection and expansion, the timing effects of mapping each candidate logic cone may be calculated and may be used to minimize the timing effects of the mappings.

Figure 5A:
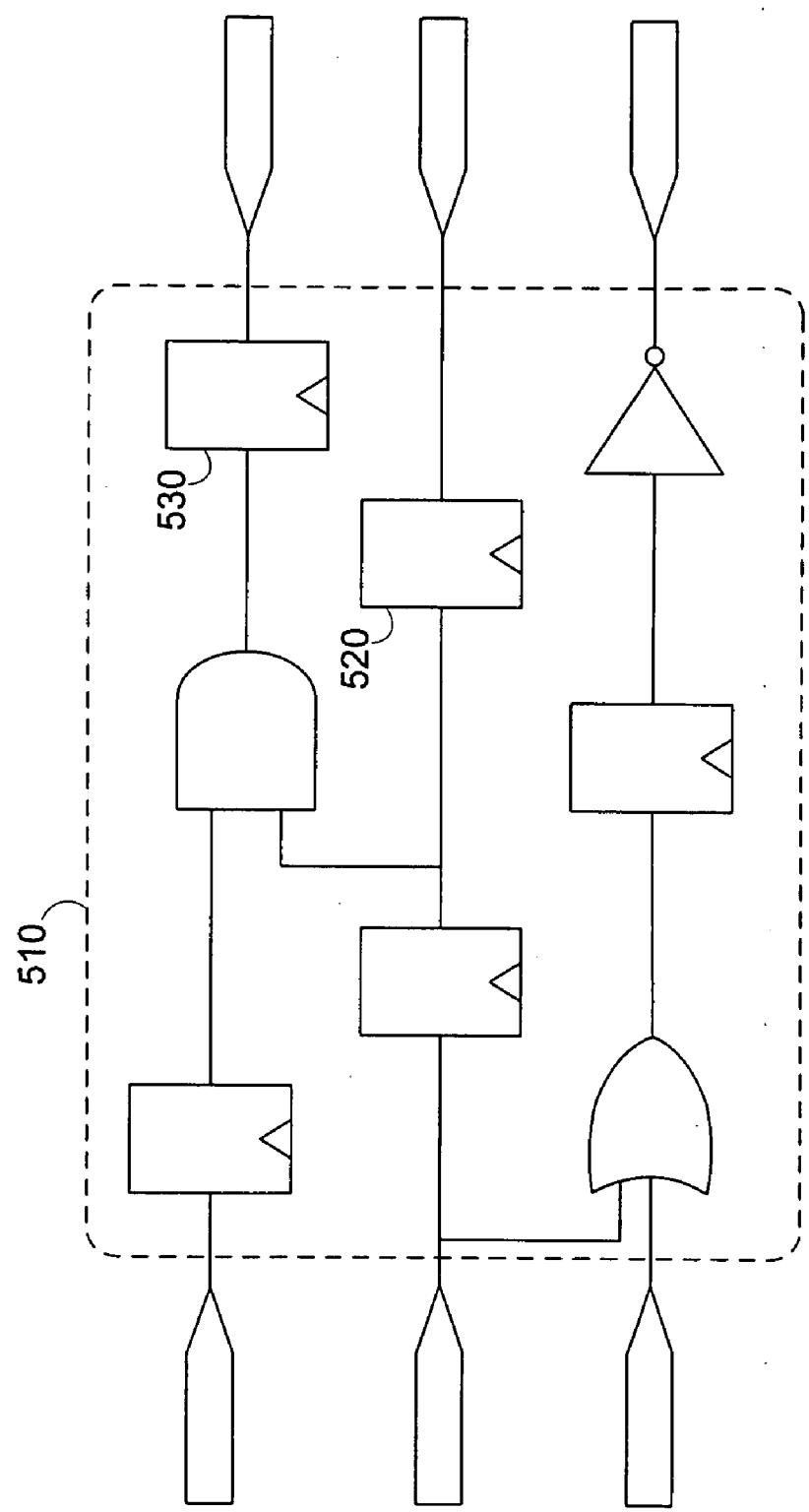
FIGS. 5A and 5B are simplified schematic block diagrams illustrating the restructuring of a logic cone in accordance with the invention.
Figure 5B:
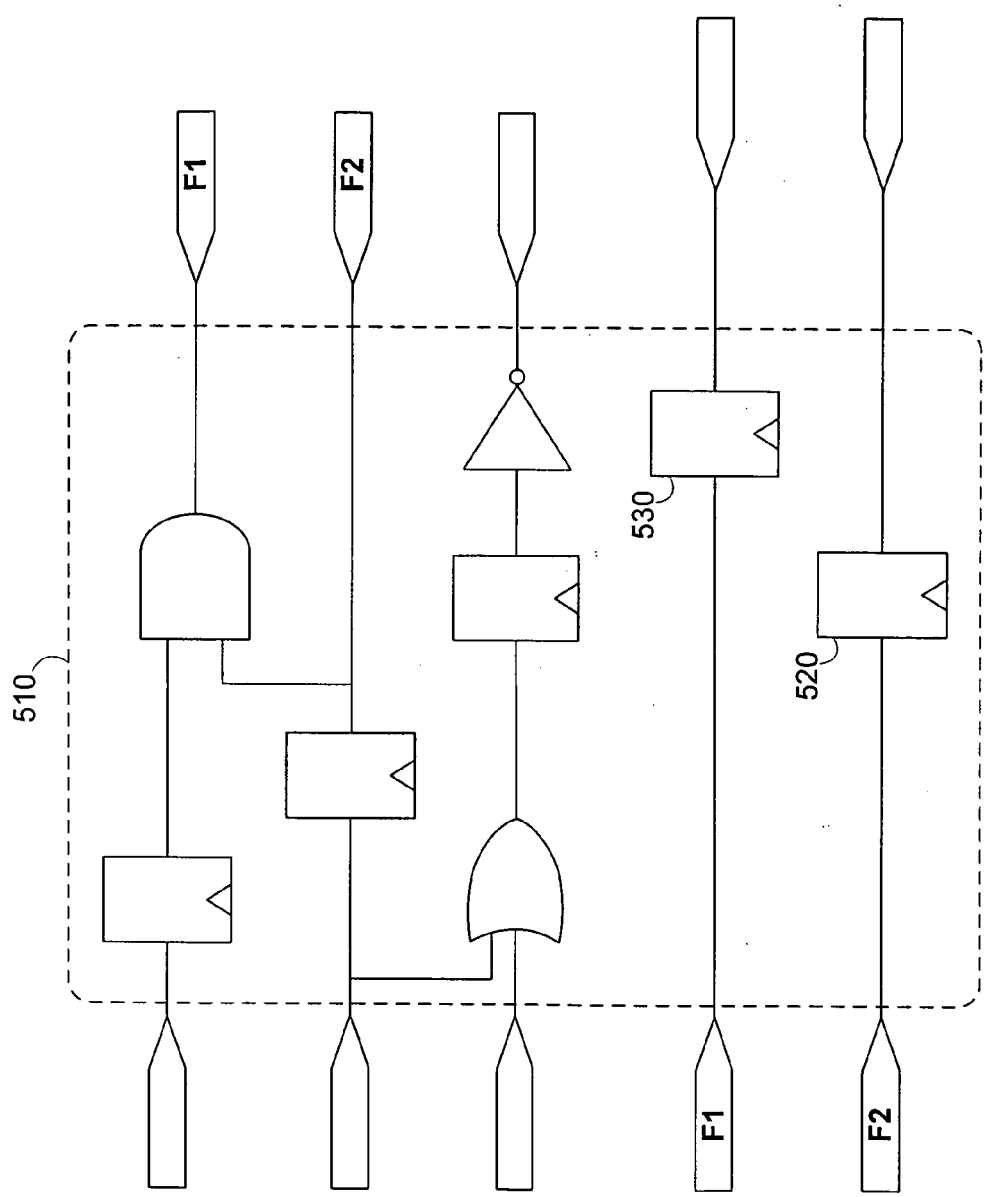

After a candidate logic cone is analyzed and selected for mapping, the logic cone may need to be restructured in order to be compatible with the mapping into a synchronous EMB. An example illustrating the restructuring of an arbitrary cone of sequential logic into one compatible with mapping into a synchronous EMB is shown in FIGS. 5A and 5B. FIG. 5A shows sequential logic elements that are selected to be include in logic cone 510. However, in order to be mapped into a synchronous EMB, logic cone 510 must be restructured so that each path through the logic cone traverses exactly one register node. This restructuring may be performed to make the logic cone conform to the structure of a synchronous EMB, in which there is only one register node in each input path. Registers 520 and 530 may be restructured to create two new paths through logic cone 510 by forcing the inputs to these registers to leave and re-enter the logic cone. FIG. 5B shows restructured logic cone 510. The inputs to registers 520 and 530 have been restructured to create feedback inputs/outputs F1 and F2 thereby maintaining one register per logic cone path.

Figure 7:
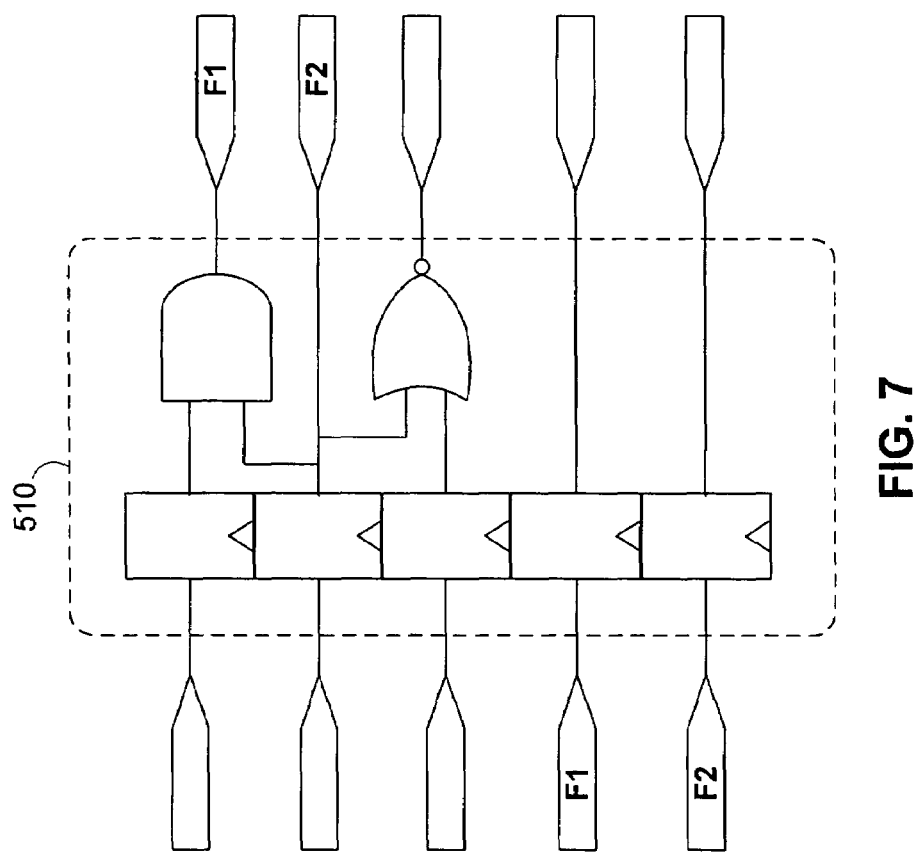
FIG. 7 is another simplified schematic block diagram illustrating the retiming of a logic cone for mapping into a synchronous EMB in accordance with the invention.

In addition to restructuring the logic cones, the logic cones may also need to be retimed such that all of the register nodes are located at the input of the logic cones. This retiming may be performed in order to make sure that the register nodes of the logic cone are located at the input of the logic cone, just like the inputs to the synchronous EMBs. An example illustrating this retiming is shown in FIGS. 6A and 6B. FIG. 6A shows sequential logic elements that are selected to be included in logic cone 610. FIG. 6B shows logic cone 610 after being implicitly retimed so that the register nodes are located at the input of the logic cone. As another example, FIG. 7 shows logic cone 510 (FIGS. 5A and 5B) after being implicitly retimed in a similar manner. After logic cones are selected, expanded, restructured, and retimed, as necessary, they may be mapped into the synchronous EMBs.

Figure 8:
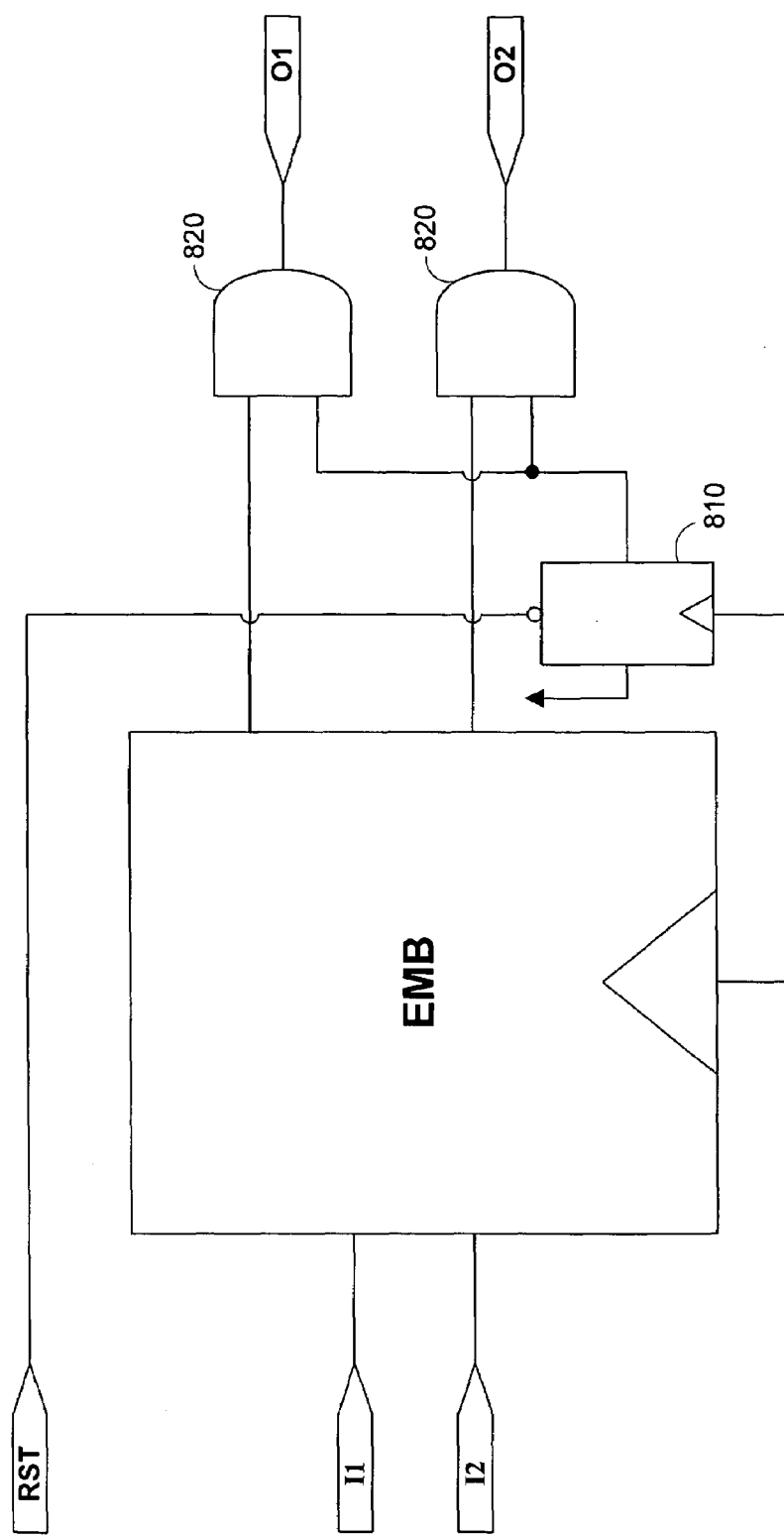
FIG. 8 is a simplified schematic block diagram illustrating additional logic that may be added to a synchronous EMB to implement an asynchronous reset signal in accordance with the invention.

Another aspect of the invention relates to techniques for compensating for the inability of typical synchronous EMBs to implement asynchronous resets. It is expected that at least some sequential logic cones selected for mapping will include asynchronous reset signals. Synchronous EMBs in typical PLDs do not include asynchronous reset signals. While some synchronous EMBs contain asynchronous clear signals, the output of the memory may not show the effect of the asynchronous clear until the next rising clock edge. As a result, additional logic may be added outside the synchronous EMBs to add the functionality of an asynchronous reset to the synchronous EMBs. FIG. 8 shows an illustrative synchronous EMB having external logic that implements an asynchronous reset. The external logic includes register 810 and AND gates 820. For a particular logic cone mapped into a synchronous EMB, the external logic will include one register and one combinational node (e.g., an AND gate) per output of the memory. This additional logic reduces the expected gains from performing the memory mapping operation, but may be included in any cost function used to calculate the area savings. As a result of the cost function calculations, logic cones that do not include asynchronous reset signals may be selected for mapping because they have lower costs than logic cones that include the asynchronous reset signals.

Figure 9A:
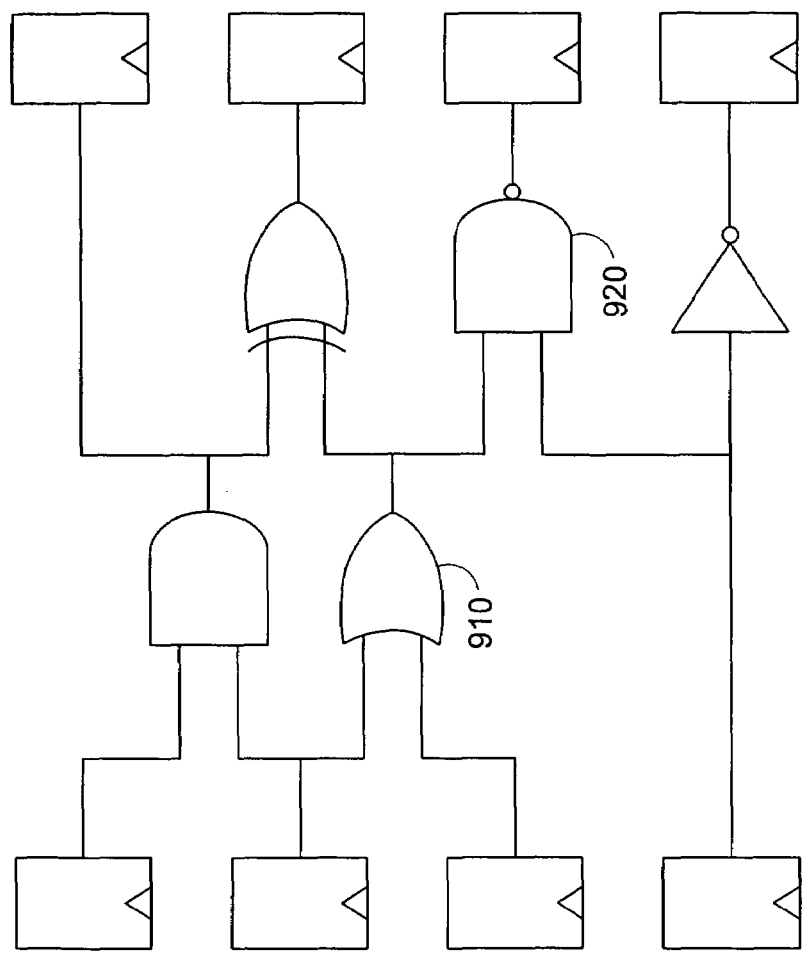
FIGS. 9A and 9B are simplified schematic block diagrams illustrating a technique for mapping combinational logic into a synchronous EMB in accordance with the invention.
Figure 9B:
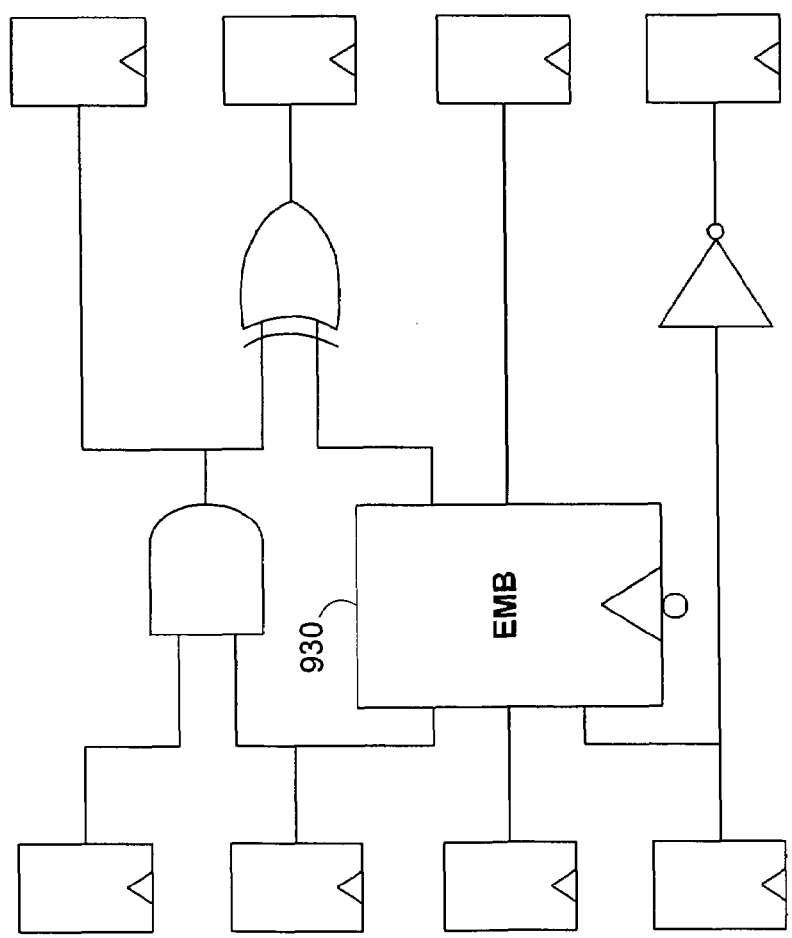

As discussed above, in general, every path from input to output in a logic cone must traverse at least one register. However, if asynchronous EMBs were available, it would be possible to map logic cones containing only combinational logic into the asynchronous EMBs. In some embodiments, the functionality of an asynchronous memory implementing combinational logic may be achieved using a synchronous EMB clocked with an inverted clock signal. This would allow the logic function mapped into this synchronous EMB to produce a valid output before the next clock edge of the non-inverted clock signal, thus enabling this output to be a valid input to other synchronous EMBs. An example of this technique is shown in FIGS. 9A and 9B. Combinational nodes 910 and 920 of FIG. 9A may be replaced by synchronous EMB 930 shown in FIG. 9B. In order to successfully map combinational logic cones into synchronous EMBs in this manner, a few conditions may need to be met. For example, the combinational logic cone should be located between a set of compatible registers, the synchronous EMBs implementing the combinational logic cones should not be directly connected to one another, and the timing of the mapped logic cone should not be critical. Further, extra logic may also be required to implement an asynchronous reset.

Figure 10:
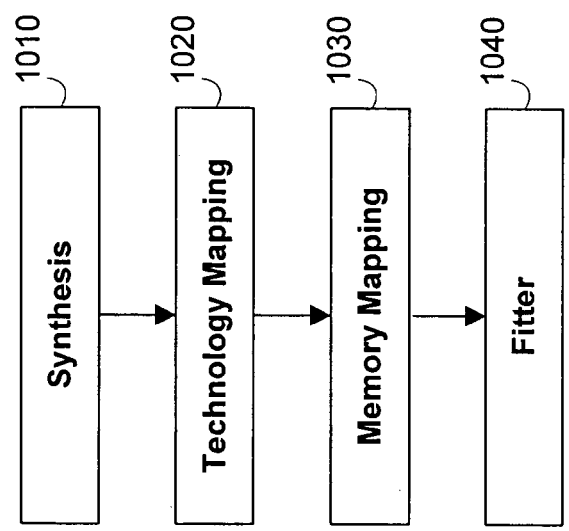
FIG. 10 is a simplified flow chart of an illustrative method for mapping logic functions into synchronous EMBs in accordance with the invention.

FIG. 10 is a flow chart of an illustrative method for mapping logic functions into synchronous EMBs in accordance with the invention. At step 1010 the circuit to be implemented in the PLD is synthesized and at step 1020 the circuit is mapped into a particular PLD technology. At step 1030 the mapped circuit may be analyzed to map logic implemented in LEs into synchronous EMBs. As a result of this memory mapping, the number of LEs may be reduced and a smaller PLD may be used to implement the circuit. In some instances, based on the results of the memory mapping, step 1020 may be repeated to map the circuit into a different technology having different logic and memory capacities. Finally, at step 1040 the fitter maps the circuit into the selected PLD. The circuit may then be simulated, modified, and eventually programmed onto the PLD.

Figure 11:
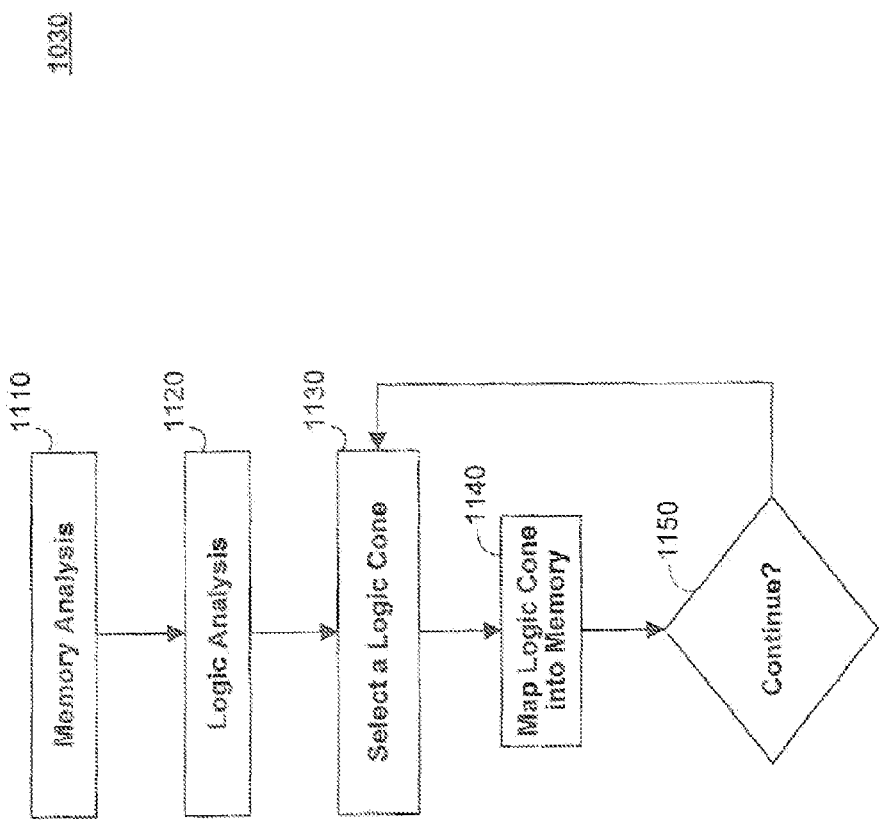
FIG. 11 is another simplified flow chart of an illustrative method for mapping logic functions into synchronous EMBs in accordance with the invention.

FIG. 11 is a more detailed flow chart of an illustrative method for performing the memory mapping of step 1030 (FIG. 10) in accordance with the invention. At step 1110 the memory may be analyzed to determine the number of EMBs that are available for mapping and at step 1120 a logic analysis may be performed to determine the usage of the LEs. The logic analysis of step 1120 may also include a timing analysis of the logic. This timing analysis may identify critical logic nodes that may not be suitable candidates for mapping into the synchronous EMBs. Further, the timing analysis may identify or rank the relative importance of the logic nodes. For example, the less important logic nodes may be selected for mapping before more important logic nodes. Based on the analysis of the memory and the logic, at step 1130 a logic cone is selected to be mapped into a synchronous EMB. The steps involved in selecting the logic cones will be discussed in more detail with respect to the method illustrated in FIG. 12. At step 1140 the selected logic cone may be mapped into the synchronous EMB. Mapping the logic cone into the synchronous EMB may also include adding additional logic, such as the logic required to perform an asynchronous reset. Finally, at step 1150 the memory and logic of the circuit are analyzed again to determine whether additional logic should be mapped into synchronous EMBs. In part, the amount of memory available, the amount of logic available to be mapped, the timing cost of the mapping, and the area reduction caused by the mapping are all considered to determined whether or not the mapping of the logic into synchronous EMBs should continue.

Figure 12:
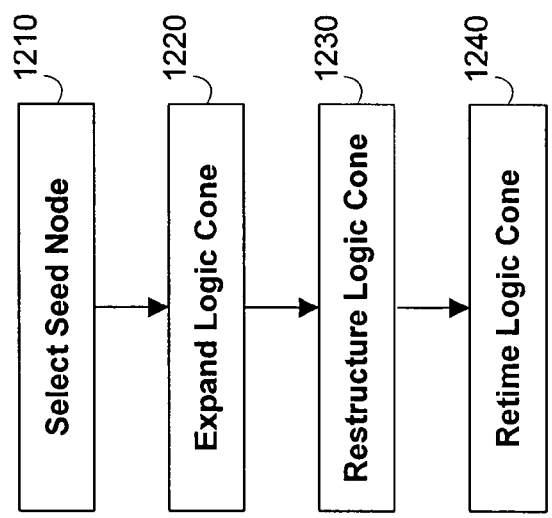
FIG. 12 is a simplified flow chart of an illustrative method selecting logic cones for mapping into a synchronous EMB in accordance with the invention.

FIG. 12 is a more detailed flow chart of an illustrative method for selecting logic cones at step 1130 (FIG. 11) in accordance with the invention. At step 1210 a seed node is selected and at step 1220 the seed node may be expanded into a logic cone. The selection of the seed node as well as the expansion into the logic cone may be performed based on an analysis of the circuit logic and the available memory. Seed nodes may be selected to maximize the area reduction and minimize the timing costs associated with any potential mapping. It should be understood that any number of suitable techniques may be used to select the seed nodes that are grown into the logic cones. For example, some techniques may iteratively calculate a cost function associated with all suitable candidate logic cones in order to select the best candidate logic cone. Some techniques may be fully automatic while other techniques may allow a user to guide the selection process. After a candidate logic cone is selected for mapping into a synchronous EMB, at steps 1230 and 1240 the logic cone may be restructured or retimed, if necessary to put the logic cone in an appropriate form for the mapping.

It will be apparent that the foregoing is only illustrative of the principles of the invention, and that various modifications can be made by those skilled in the art without departing from the scope and spirit of the invention.

The invention claimed is:
1. A method for mapping logic functions implemented in logic elements into synchronous embedded memory blocks comprising:
    determining the availability of the synchronous embedded memory blocks;
    analyzing the logic functions implemented in the logic elements;
    selecting a cone of logic comprising at least a portion of one of the logic functions; and mapping the logic cone into a portion of the available synchronous embedded memory blocks.

2. The method of claim 1 wherein analyzing the logic functions comprises performing a timing analysis on the logic functions.

3. The method of claim 1 wherein selecting the logic cone comprises selecting a non-critical logic cone.

4. The method of claim 1 wherein selecting the logic cone comprises calculating a cost function associated with the logic cone.

5. The method of claim 4 wherein selecting the logic cone comprises selecting a logic cone in response to calculating the cost function.

6. The method of claim 1 wherein mapping the logic cone comprises restructuring the logic cone.

7. The method of claim 1 wherein mapping the logic cone comprises retiming the logic cone.

8. The method of claim 1 wherein mapping the logic cone comprises adding logic to implement an asynchronous reset.

9. The method of claim 1 wherein the logic cone comprises only combinational logic and wherein mapping the logic cone comprises mapping the logic cone into a synchronous embedded memory block clocked with an inverted clock signal.

10. A method for mapping logic functions implemented in logic elements into synchronous embedded memory blocks comprising:
    selecting a seed node from one of the logic functions;
    expanding the seed node to form a cone of logic;
    rearranging the logic cone to be mappable into the synchronous embedded memory blocks; and
    mapping the rearranged logic cone into the synchronous embedded memory blocks.

11. The method of claim 10 wherein selecting the seed node comprises selecting a seed node associated with a non-critical logic function.

12. The method of claim 10 wherein expanding the seed node comprises selecting at least one input register of the seed node.

13. The method of claim 12 wherein expanding the seed node further comprises selecting all compatible registers associated with the seed node.

14. The method of claim 13 wherein expanding the seed node further comprises selecting combinational nodes connected to the registers.

15. The method of claim 10 further comprising expanding the logic cone to form an expanded logic cone.

16. The method of claim 10 further comprising calculating a cost function associated with the logic cone.

17. The method of claim 10 wherein rearranging the logic cone comprises restructuring the logic cone such that only one register is located in each path through the logic cone.

18. The method of claim 10 wherein rearranging the logic cone comprises retiming the logic cone such that the input to each path through the logic cone comprises a register.

19. The method of claim 10 wherein mapping the logic cone comprises adding logic to implement an asynchronous reset.

20. A system for mapping logic functions implemented in logic elements into synchronous embedded memory blocks wherein the system comprises:
    a module to determine the availability of the synchronous embedded memory blocks;
    a module to analyze the logic functions implemented in the logic elements;
    a module to select a cone of logic comprising at least a portion of one of the logic functions; and
    a module to map the cone of logic into a portion of the available synchronous embedded memory blocks.

21. The system of claim 20 wherein analyzing the logic functions comprises performing a timing analysis on the logic functions.

22. The system of claim 20 wherein selecting the logic cone comprises selecting a non-critical logic cone.

23. The system of claim 20 wherein selecting the logic cone comprises calculating a cost function associated with the logic cone.

24. The system of claim 23 wherein selecting the logic cone comprises selecting a logic cone in response to calculating the cost function.

25. The system of claim 20 wherein mapping the logic cone comprises restructuring the logic cone.

26. The system of claim 20 wherein mapping the logic cone comprises retiming the logic cone.

27. The system of claim 20 wherein mapping the logic cone comprises adding logic to implement an asynchronous reset.

28. The system of claim 20 wherein the logic cone comprises only combinational logic and wherein mapping the logic cone comprises mapping the logic cone into a synchronous embedded memory block clocked with an inverted clock signal.

29. A system for mapping logic functions implemented in logic elements into synchronous embedded memory blocks wherein the system comprises:
    a module to select a seed node from one of the logic functions;
    a module to expand the seed node to form a cone of logic;
    a module to rearrange the logic cone to be mappable into the synchronous embedded memory blocks; and
    a module to map the rearranged logic cone into the synchronous embedded memory blocks.

30. The system of claim 29 wherein selecting the seed node comprises selecting a seed node associated with a non-critical logic function.

31. The system of claim 29 wherein expanding the seed node comprises selecting at least one input register of the seed node.

32. The system of claim 31 wherein expanding the seed node further comprises selecting all compatible registers associated with the seed node.

33. The system of claim 32 wherein expanding the seed node further comprises selecting combinational nodes connected to the registers.

34. The system of claim 29 wherein the system is further operable to expand the logic cone to form an expanded logic cone.

35. The system of claim 29 wherein the system is further operable to calculate a cost function associated with the logic cone.

36. The system of claim 29 wherein rearranging the logic cone comprises restructuring the logic cone such that only one register is located in each path through the logic cone.

37. The system of claim 29 wherein rearranging the logic cone comprises retiming the logic cone such that the input to each path through the logic cone comprises a register.

38. The system of claim 29 wherein mapping the logic cone comprises adding logic to implement an asynchronous reset.

* * * * *